US006741620B2

(12) United States Patent
Gerstenberger et al.

(10) Patent No.: US 6,741,620 B2
(45) Date of Patent: May 25, 2004

(54) METHODS AND DEVICES FOR EFFICIENT GENERATION OF ULTRAVIOLET LIGHT

(75) Inventors: David C. Gerstenberger, Bothell, WA (US); Mark S. Bowers, Bothell, WA (US)

(73) Assignee: Aculight Corporation, Bothell, WA (US)

(*) Notice: Subject to any disclaimer, the term of this patent is extended or adjusted under 35 U.S.C. 154(b) by 123 days.

(21) Appl. No.: 10/076,696

(22) Filed: Feb. 12, 2002

(65) Prior Publication Data

US 2002/0126715 A1 Sep. 12, 2002

Related U.S. Application Data

(60) Provisional application No. 60/269,152, filed on Feb. 15, 2001.

(51) Int. Cl.[7] .............................. H01S 3/10; H01S 3/04
(52) U.S. Cl. .............................. 372/22; 372/21; 372/34
(58) Field of Search ..................... 372/20, 21, 34, 372/22

(56) References Cited

U.S. PATENT DOCUMENTS

| | | | |
|---|---|---|---|
| 5,740,190 A | 4/1998 | Moulton | 372/23 |
| 5,862,163 A | 1/1999 | Umezu et al. | 372/21 |
| 5,880,877 A | 3/1999 | Fermann et al. | 359/341 |
| 6,033,223 A | 3/2000 | Narusawa et al. | 433/226 |
| 6,101,201 A * | 8/2000 | Hargis et al. | 372/36 |

* cited by examiner

Primary Examiner—Paul Ip
Assistant Examiner—James Menefee
(74) Attorney, Agent, or Firm—Bingham McCutchen LLP; David G. Beck

(57) ABSTRACT

Efficient devices and methods for producing ultraviolet light are provided. One such device includes a diode-pumped 946 nanometer solid state laser, a first nonlinear crystal for generating blue light at approximately 473 nanometers, and a second nonlinear crystal for doubling the frequency of the blue light to produce a fourth harmonic beam of ultraviolet light at approximately 236.5 nanometers. In some embodiments, the second nonlinear crystal is a cooled CLBO crystal angle-tuned for non-critical phase-matching to provide high conversion efficiency. Some embodiments include a second laser which emits a fundamental beam having a wavelength of more than one micron and a third nonlinear crystal for sum-frequency mixing the fundamental beam and the fourth harmonic beam to output an ultraviolet beam having a wavelength of less than 200 nanometers.

20 Claims, 6 Drawing Sheets

METHODS AND DEVICES FOR EFFICIENT GENERATION OF ULTRAVIOLET LIGHT

CROSS-REFERENCE TO RELATED APPLICATION

This application claims priority based on U.S. Provisional Patent Application No. 60/269,152, filed Feb. 15, 2001, the disclosure of which is incorporated herein by reference for all purposes.

BACKGROUND OF THE INVENTION

There are many scientific and industrial applications which require ultraviolet (UV) laser light with good beam quality. Such applications include, but are not limited to, irradiating masks for integrated circuit fabrication, micromachining of high-density semiconductor memory devices, drilling precisely controlled holes in multi-layer circuit boards and manufacturing fiber Bragg gratings (FBGs). However, no laser apparatus presently used for such applications is entirely satisfactory.

FBGs are portions of optical waveguides, such as optical fibers, which have been processed to reflect and transmit specific wavelengths. Producing FBGs involves exposing the fiber to UV light, the intensity of which varies between light and dark along the length of the fiber. The light and dark bands of exposure are placed along the fiber with spacing comparable to the wavelength of light to be reflected by the fiber in operation. The UV light induces changes in the index of refraction of the fiber, producing an index grating along the length of the fiber.

A light source used for exposure of a fiber to make FBGs must provide light within specific ranges of wavelengths in the UV portion of the spectrum. A typical fiber's primary wavelength range for absorption peaks near 240 nanometers, and wavelengths differing from the peak by more than about 10 nanometers are significantly less effective. Even at the peak wavelength, only a small fraction of the laser power is absorbed, so it is highly desirable for the light source to provide light at a wavelength near the absorption peak.

The current sources of UV light used for the previously-described applications have various drawbacks. For example, most current production systems for FBGs and integrated circuits use excimer lasers. Excimer lasers can produce output beams with high average powers, which facilitates processing, but they have serious disadvantages. They require toxic, corrosive gases for operation, have high operating and maintenance costs, and produce short duration (~50 nanoseconds), low repetition rate (<1000 hertz), high peak output power (~1 Megawatt) UV pulses. The output beams of excimer lasers have relatively poor beam quality. Moreover, the high peak output powers of excimer lasers cause damage to optical fibers, weakening them and making them susceptible to fracture.

Several other types of lasers have been used for integrated circuit manufacturing and FBG production, but none are entirely satisfactory. For example, ion lasers provide good beam quality at a number of wavelengths in the UV, but have high operating costs, produce weak output and are very inefficient. The output beams of frequency-doubled ion lasers typically have powers of one-half watt or less, poor beam quality, and short operational lifetimes. The output wavelength of frequency-doubled copper vapor lasers is slightly too long to be optimal. Liquid dye lasers are impractical for large-scale industrial production since they require frequent changes of the liquid dye solution to maintain operation.

Solid-state lasers which include active laser media such as neodymium-doped yttrium aluminum garnet (Nd:YAG), Nd:LiYF$_4$ (Nd:YLF), Yb:YAG, Yb: phosphate glass, etc., can be efficient and can provide output power with good beam quality. Incorporating a diode pump can result in a compact laser device. The most efficient output of such lasers lies in the infrared portion of the spectrum near 1064 nanometers and 1319 nanometers. Accordingly, fundamental wavelengths of greater than 1 micron are selected for high-power applications.

The infrared output of diode-pumped lasers can be efficiently converted to the green portion of the spectrum by nonlinear frequency conversion such as second harmonic generation (SHG) or frequency doubling. A number of crystalline materials are used for nonlinear frequency conversion, such as lithium niobate, lithium triborate (LBO), or potassium titanyl phosphate (KTP).

However, subsequent conversion of these visible outputs into the UV by sum-frequency-mixing or frequency-doubling is typically less efficient. This stems primarily from the properties of the nonlinear optical materials used for UV light generation: LBO, β-barium borate (BBO), and cesium lithium borate (CLBO).

For these and other reasons, prior art UV laser systems suffer from relatively low conversion efficiency and/or poor beam quality. Moreover, none of these prior art lasers can efficiently provide a high-quality output beam having a wavelength near 240 nanometers, which would be suitable for FBG production and other applications.

SUMMARY OF THE INVENTION

The present invention provides devices and methods for efficiently producing output beams with wavelengths near 240 nanometers from solid state lasers.

In one preferred embodiment, the diode-pumped infrared solid-state laser is a Nd:YAG laser operating on the 946 nanometer line, rather than the more commonly-used 1064 nanometer line. The 946 nanometer wavelength is frequency-doubled to 473 nanometers in the blue using periodically-poled potassium titanyl phosphate (PPKTP), LBO, or a similar nonlinear crystal. The 473 nanometer blue light is converted to an ultraviolet fourth harmonic beam using a non-critically phase matched (NCPM) CLBO crystal.

The use of the 946 nanometer infrared laser wavelength provides for enhanced UV light generation using non-critical phase-matching in CLBO, and this combination provides for efficient overall generation of 236 nanometer UV light.

In some embodiments, the first CLBO crystal is cooled to between −10 degrees centigrade and −20 degrees centigrade. In some embodiments, the first CLBO crystal is disposed in a container of dry inert gas such as nitrogen, dry air, helium, neon, argon, krypton or xenon. In other embodiments the first CLBO crystal is disposed in a vacuum.

In some embodiments, UV light with wavelengths below 237 nanometers is generated by sum-frequency mixing using NCPM CLBO. In some such embodiments, a rare earth doped garnet laser is tuned to emit a second fundamental beam at a wavelength of approximately 1077 nanometers, the second fundamental beam and the fourth harmonic beam are directed to a second cesium lithium borate crystal for sum-frequency mixing to produce an output beam at approximately 194 nanometers.

In other embodiments of the present invention, an apparatus for generating ultraviolet light includes: a garnet crystal doped with a rare earth element; a diode pump laser for pumping the garnet crystal; a resonator for generating a fundamental beam having a wavelength of approximately 946 nanometers from the pumped garnet crystal; a periodically-poled potassium titanyl phosphate crystal for producing a second harmonic beam having a wavelength of approximately 473 nanometers; and a CLBO crystal cooled to a temperature in the range from −10° centigrade to −20° centigrade and oriented for non-critical phase-matching, for producing a fourth harmonic beam having a wavelength of approximately 237 nanometers.

In some such embodiments, the garnet crystal is a neodymium-doped yttrium aluminum garnet crystal. The neodymium-doped yttrium aluminum garnet crystal may include a first un-doped end portion, a doped central portion and a second un-doped end portion.

In yet other embodiments of the present invention, an apparatus for generating ultraviolet light includes: an Nd:LiYF$_4$ laser tuned to output a fifth harmonic at approximately 209 nanometers; a garnet laser doped with a rare earth element and tuned to output a fundamental beam at approximately 1305 nanometers; and a CLBO crystal for sum-frequency mixing the fundamental beam and the fifth harmonic beam to produce an output beam at approximately 180 nanometers.

DESCRIPTION OF THE SPECIFIC EMBODIMENTS

Figure 1:
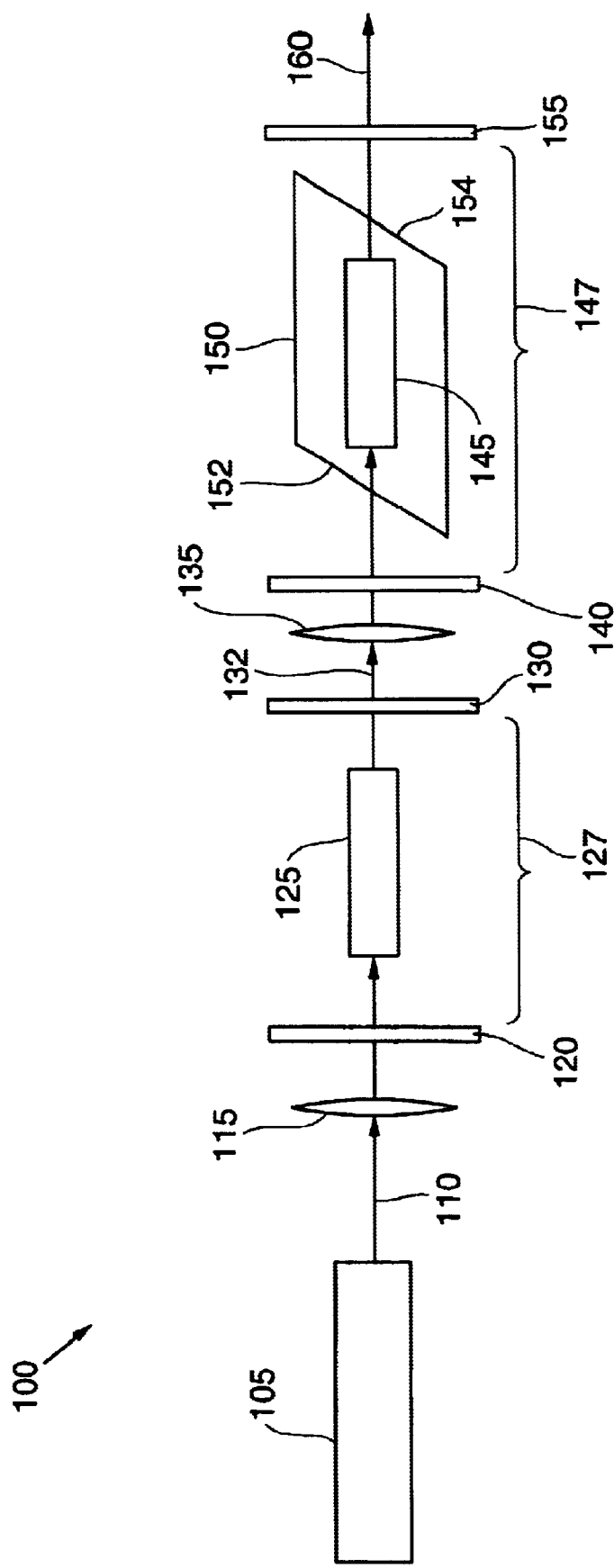
FIG. 1 illustrates one embodiment of a laser device according to the present invention.

FIG. 1 illustrates one embodiment of laser device 100 according to the present invention. In summary, laser 105 outputs infrared (IR) fundamental beam 110 having a wavelength of approximately 946 nanometers, which is frequency-doubled by first nonlinear crystal 125 to generate blue second harmonic beam 132 having a wavelength of approximately 473 nanometers. Second harmonic beam 132 is frequency-doubled by second nonlinear crystal 145 to produce UV output beam 160 at approximately 237 nanometers.

In the embodiment depicted in FIG. 1, fundamental beam 110 is imaged by lens 115 into first nonlinear crystal 125. Fundamental beam 110 may be pulsed or continuous wave (CW). Optional mirrors 120 and 130 define optional resonator 127, and optional mirrors 140 and 155 define optional resonator 147. Resonators 127 and 147 are used in some embodiments of laser device 100 in which fundamental beam 110 is CW. Mirrors 120, 130, 140 and 155 are omitted from most embodiments of laser device 100 in which fundamental beam 110 is pulsed, because most such pulsed beams have sufficiently high power that only one pass through first nonlinear crystal 125 and second nonlinear crystal 145 is required to produce output beam 160 at an acceptable power level.

In some preferred embodiments, nonlinear crystal 125 is formed of periodically-poled potassium titanyl phosphate (PPKTP). In some such embodiments, nonlinear crystal 125 has a grating period of 6.09 microns, which phase-matches the 946 nanometer output of fundamental beam 110 with the 473 nanometer second harmonic beam 132 at a temperature of approximately 25° centigrade. In one such embodiment, nonlinear crystal 125 is formed of PPKTP with a thickness of 1 millimeters, a width of 5 millimeters and a length of 10 millimeters. However, nonlinear crystal 125 may be formed in a variety of dimensions. In some preferred embodiments, nonlinear crystal 125 includes anti-reflective (AR) coatings for 946 nanometers and 473 nanometers. One vendor for such PPKTP crystals is Cobalt AB of Stockholm, Sweden. Nonlinear crystal 125 may also be formed of BBO, LBO or other materials.

When nonlinear crystal 125 is formed of PPKTP, optimum focusing into nonlinear crystal 125 occurs when lens 115 is configured for near confocal focusing. For a PPKTP crystal having a length of 10 millimeters, confocal focusing corresponds to a focused 946 nanometer spot size of 30 microns. Looser focusing (in which the spot size is larger) reduces optical damage in nonlinear crystal 125, but also reduces nonlinear conversion efficiency.

Second harmonic beam 132 can be separated from fundamental beam 110 by using dichroic mirrors, optical absorption filters, prisms, or similar devices. Some preferred embodiments of laser device 100 use a Pellin-Broca prism to separate second harmonic beam 132 from the residual 946 nanometer light of fundamental beam 110.

Lens 135 focuses second harmonic beam 132 into second nonlinear crystal 145. In preferred methods according to the present invention, lens 135 is adjusted for confocal focusing. In one such embodiment, lens 135 is adjusted for confocal focusing into nonlinear crystal 145 having a length of 10 millimeters, thereby producing a spot having a radius of approximately 21 microns.

For reasons which will be described in detail below, second nonlinear crystal 145 is preferably formed of CLBO. In one such embodiment, nonlinear crystal 145 is formed of a CLBO crystal with an azimuth angle $\Phi$ of approximately 45° and a phase-matching angle $\theta_m$ of approximately 90°. Such crystals are available from various sources, including Crystal Associates of East Hanover, N.J.

CLBO is very hydroscopic, and care must be exercised to minimize the contact of CLBO crystals with water vapor. Accordingly, when nonlinear crystal 145 is formed of CLBO, some preferred embodiments of laser device 100 include container 150 for enclosing nonlinear crystal 145. In some such embodiments, container 150 encloses nonlinear crystal 145 in a dry inert gas such as dry nitrogen, dry air, helium, argon, xenon, neon or krypton. Alternatively, container 150 can be evacuated. Preferably, sides 152 and 154 include AR-coated windows, Brewster windows, or a combination of these elements. In one embodiment, side 152 includes an entrance Brewster window oriented to present minimum optical loss for 473 nanometer light and side 154 includes an exit Brewster rotated 90° relative to the entrance Brewster window to present minimum reflection loss for 237 nanometer light.

Second harmonic beam 132 can be separated from output beam 160 by using dichroic mirrors, optical absorption filters, prisms, or similar devices. Some preferred embodiments of laser device 100 use a Pellin-Broca prism to separate second harmonic beam 132 from output beam 160.

In the following paragraphs, the components of laser device 100 will be explained in further detail with reference to FIGS. 2 through 8.

Figure 2:
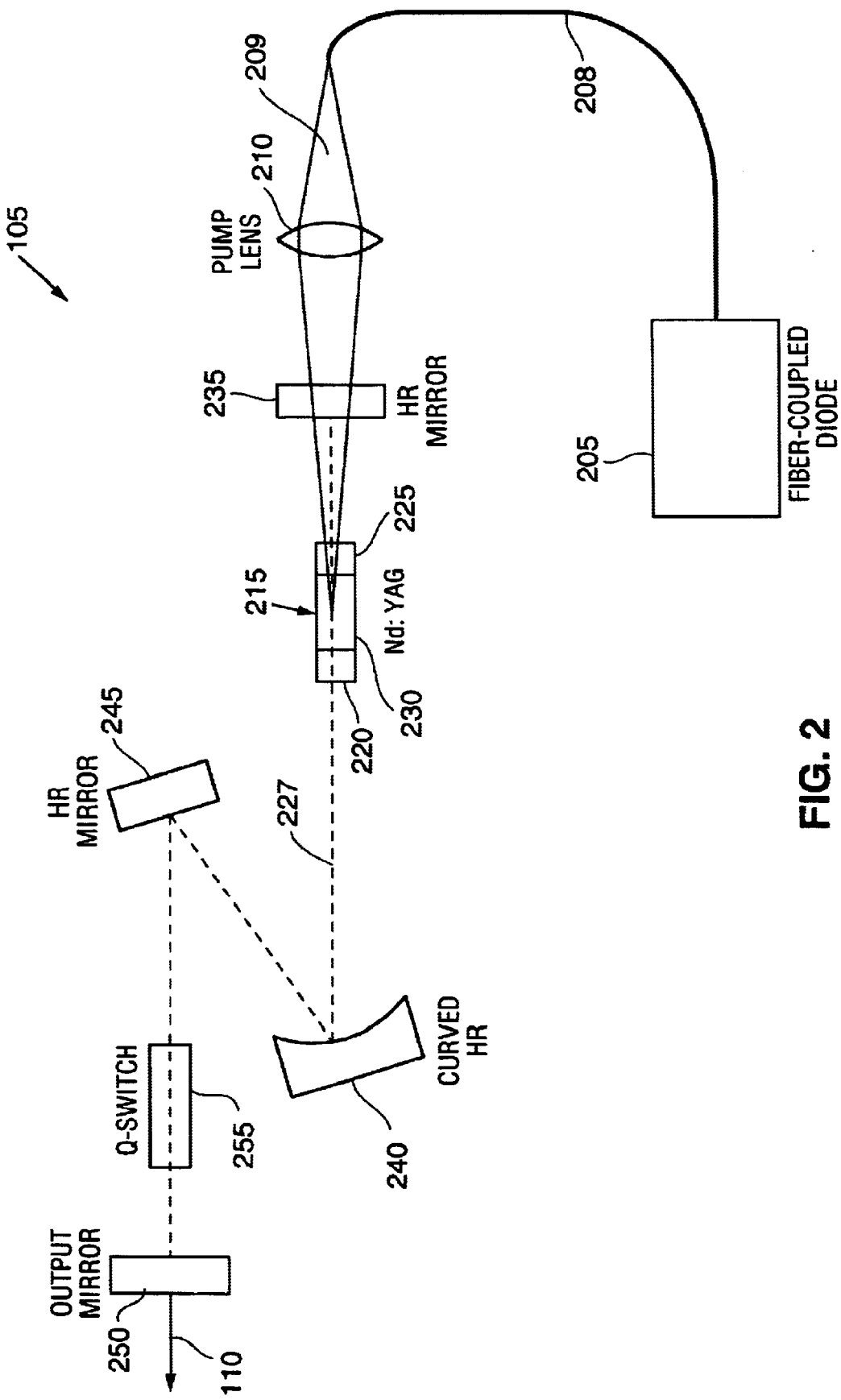
FIG. 2 illustrates one preferred embodiment of a 946 nanometer laser.

FIG. 2 illustrates one embodiment of laser 105. In this embodiment, pump laser 205 is a diode laser which emits pump beam 209. Such diode lasers may be obtained from many sources, including LIMO of Dortmund, Germany.

Pump beam 209 is coupled by optical fiber 208 to lens 210, which focuses pump beam 209 into active laser medium 215. In some embodiments, pump beam 209 may have a power in excess of 25 watts when optical fiber 208 has a 200 micron core with a numerical aperture (NA) of 0.22.

Pump beam 209 is coupled through lens 210 and mirror 235 into active laser crystal 215. In some embodiments of the present invention, lens 210 focuses output beam 209 into active laser crystal 215 with a 1:1 magnification.

Active laser crystal 215 may be any of a variety of media, but in preferred embodiments active laser crystal 215 is a garnet crystal which has been doped with at least a rare earth element. In some embodiments, active laser crystal 215 is an ND:YAG crystal. In one such embodiment, the Nd:YAG crystal is 9 millimeters long and has a diameter of 2 millimeters.

In some preferred embodiments, active laser crystal 215 has a doped central portion 230 and un-doped end portions 220 and 225. In one such embodiment, active laser crystal 215 is an Nd:YAG crystal, central portion 230 is 3 millimeters long and is doped with 1% neodymium, and undoped end portions 220 and 225 are each 3 millimeters long. Un-doped end portions 220 and 225 are preferably bonded to doped central portion 230 by a high-temperature, high-pressure process. In some preferred embodiments, end portions 220 and 225 are optically polished to laser grade specification and AR coated at 946 nanometers and 808 nanometers. One vendor for such crystals is Onyx Optics of Pleasanton, Calif.

In some such embodiments, active laser crystal 215 is wrapped with indium foil and clamped in a copper block. The copper block is mounted onto a thermo-electric cooler and temperature-controlled. Satisfactory laser performance of one such embodiment was achieved at a 160° centigrade set point.

The optical path of the embodiment of laser 105 depicted in FIG. 2 is z-shaped and includes 4 mirrors. Mirrors 235, 240 and 245 are highly reflective (HR) at 946 nanometers (>99.9%), with high transmission at 808 nanometers (>95%), 1064 nanometers (>80%) and 1319 nanometers (>50%) to suppress these lines of Nd:YAG and to promote 946 nanometer operation. In one embodiment, mirror 235 is positioned approximately 10 millimeters from the center of active laser crystal 215.

In the embodiment of laser 105 shown in FIG. 2, mirror 240 is curved. One embodiment of mirror 240 has a 200 millimeter radius of curvature and is located approximately 220 millimeters from mirror 235 and approximately 210 millimeters from the center of active laser crystal 215. Mirror 240 is tilted slightly (approximately 5 degrees from normal incidence in one embodiment) and reflects beam 227 to mirror 245.

The location of mirror 245 is not critical. In one embodiment of laser 105, mirror 245 is approximately 75 millimeters from mirror 240. Mirror 245 is tilted slightly off normal incidence and reflects beam 227 toward output mirror 250.

In one embodiment, output mirror 250 is flat, with 15% transmission at 946 nanometers and properties similar to those of mirrors 235, 240 and 245 at 808 nanometers, 1064 nanometers and 1319 nanometers. Suitable mirrors may be obtained from many vendors, including MLD Technologies of Mountain View, Calif. In one embodiment of laser 105, the total resonator length is approximately 400 millimeters.

Some embodiments of laser 105 are CW and some are pulsed. The latter embodiments include optional Q-switch 255. In some embodiments, Q-switch 255 is an acousto-optic Q-switch such as those available from Gooch & Housego of Somerset, England.

Some embodiments of laser 105 provide more than 2.5 watts of Q-switched output at a 50 kilohertz repetition frequency when pump beam 209 has a power of 18 watts. This corresponds to a 13.9% optical conversion efficiency. In some embodiments, beam 110 has $M^2 < 1.1$. $M^2$ is a ratio of the divergence of a real Gaussian beam compared to an ideal Gaussian beam. $M^2 = 1.0$ represents a beam with perfect beam quality.

Figure 3:
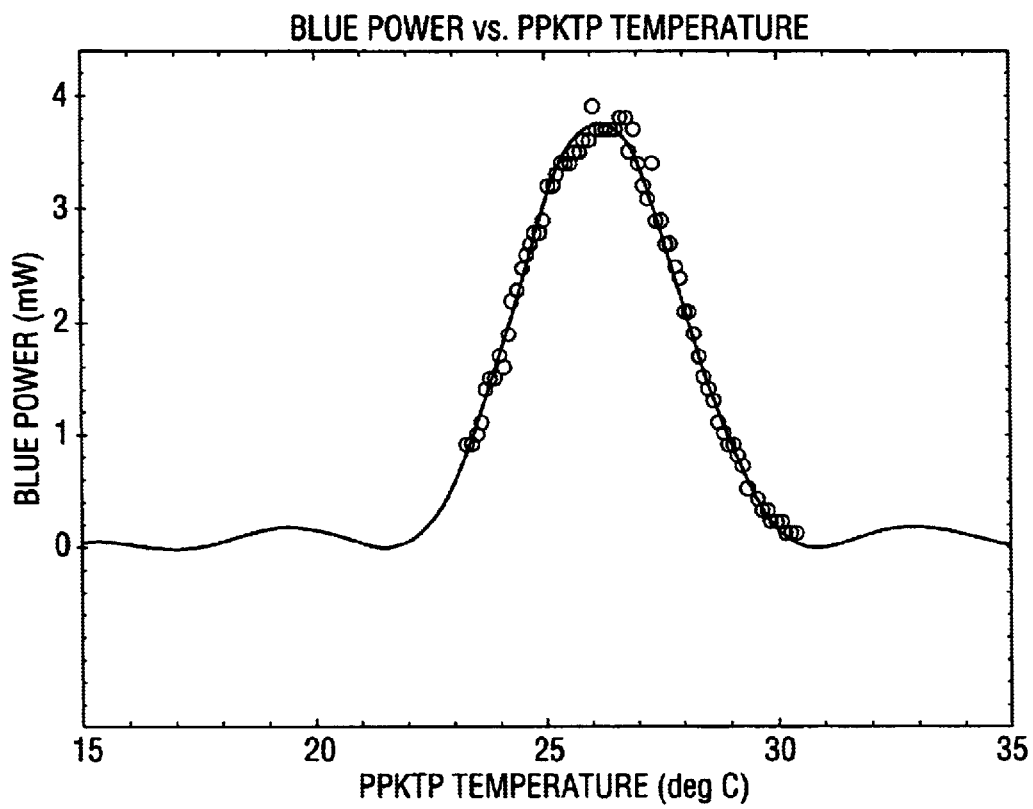
FIG. 3 is a graph which shows the temperature tuning characteristic of a 10 millimeter PPKTP crystal.

FIG. 3 is a graph which shows the temperature tuning characteristic of a 10 millimeter long PPKTP crystal: the power of second harmonic beam 132 is indicated on the vertical axis and the temperature of first nonlinear crystal 125 is indicated on the horizontal axis. The output power of the crystal used for the data points in FIG. 3 reached a maximum at about 26.5° centigrade. In general, it has been observed that embodiments which provide phase-matching at higher temperatures provide longer lifetime for nonlinear crystal 125.

As noted above with reference to FIG. 1, in some embodiments nonlinear crystal 125 has a grating period of 6.09 microns, which phase-matches the 946 nanometer output of fundamental beam 110 with the 473 nanometer second harmonic beam 132 at a temperature of approximately 25° centigrade. Other embodiments of nonlinear crystal 125 have slightly different grating periods, which provide for phase-matching at slightly different temperatures.

FIGS. 4 through 8 illustrate several important properties of CLBO. These drawings and the corresponding paragraphs set forth below indicate why CLBO, used in a NCPM configuration, is a preferred material for second nonlinear crystal 145.

Figure 4:
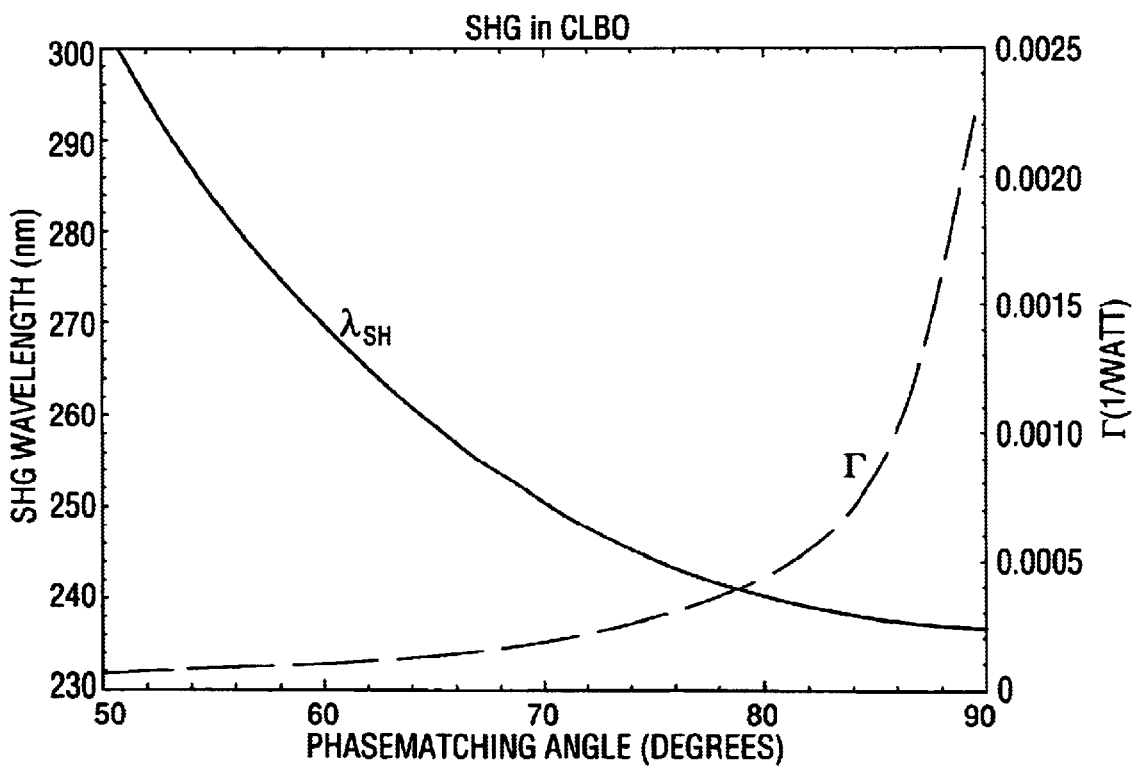
FIG. 4 indicates the relationships between second harmonic wavelength, nonlinear conversion coefficient and phase-matching angle for CLBO.

FIG. 4 is a graph which plots the second harmonic wavelength and nonlinear conversion coefficient, Γ, versus phase matching angle in CLBO. In FIG. 4, the second harmonic wavelengths indicated are in a range corresponding to those of output beam 160. The curves plotted in FIG. 4 are calculated for a crystal temperature of 300° Kelvin (27° centigrade). The 90° phase-matching angle corresponds to a non-critical phase-matching condition. The nonlinear conversion coefficient depends on crystal length, focusing, and phase-matching angle:

$$\Gamma = [(2\omega^2 d_{eff}^2 k_\omega)/(\pi n^3 \epsilon_0 c^3)] \times L h(B,\xi) \qquad \text{Equation (1)}$$

In Equation (1), ω is the laser frequency (the speed of light divided by the laser wavelength), $d_{eff}$ is the effective nonlinear coefficient of CLBO, including effects due to angle of propagation in the crystal, $k_{107}$ is the fundamental wavenumber, n is the refractive index of the crystal, $\epsilon_o$ is the permittivity of free space, c is the speed of light, L is the length of the crystal, and $h(B,\xi)$ is the Boyd and Kleinman focusing factor.

The angular dependence of $d_{eff}$ is given by:

$$d_{eff} = d_{36} \sin \theta_m \qquad \text{Equation (2)}$$

In Equation (2), $\theta_m$ is the phase-matching angle and $d_{36}$=0.95 pm/volt. In FIG. 4, Γ is calculated for a CLBO crystal length L of 10 millimeters.

FIG. 4 indicates that as the phase-matching angle approaches the non-critical point, Γ increases rapidly and reaches a value of approximately 0.0024 per watt at 90°. This value corresponds to a second harmonic wavelength of approximately 237 nanometers.

Figure 5:
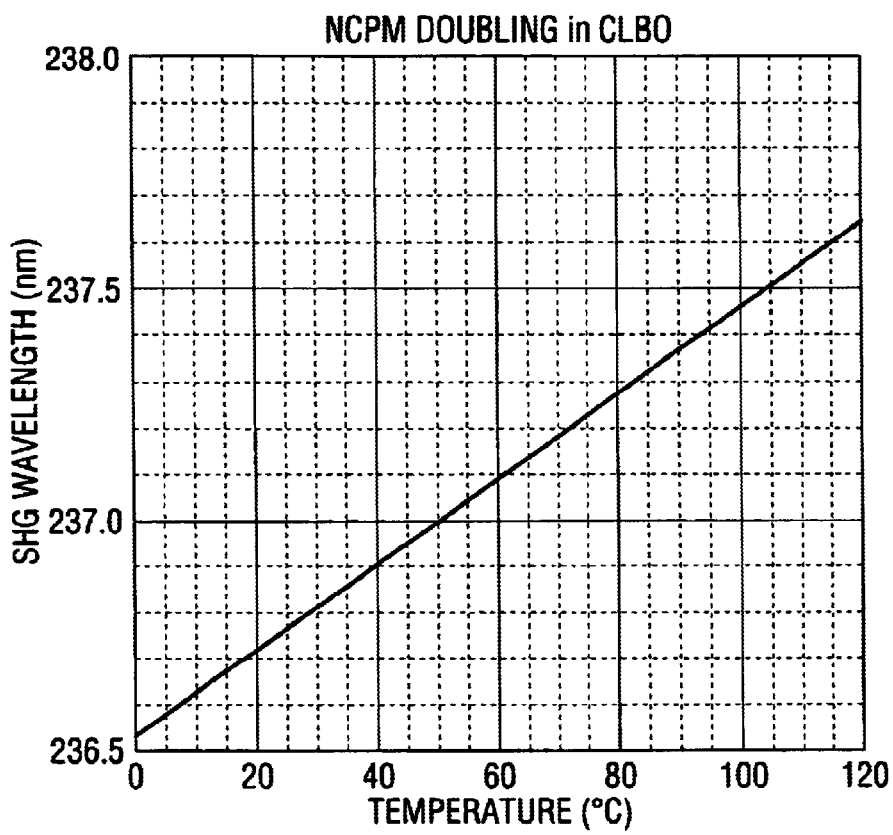
FIG. 5 is a graph on which values of NCPM wavelength and CLBO crystal temperature are plotted.

FIG. 5 shows the variation of the second harmonic wavelength for non-critical phase matching as a function of crystal temperature. Note that the second harmonic wavelength varies approximately 0.01 nanometers per degree centigrade. Experiments performed in connection with the subject invention revealed that the phase-matching temperature for the fourth harmonic of the 946 nanometer line from an Nd:YAG laser at approximately 236.5 nanometers was approximately −15° centigrade. According to FIG. 5, the shortest second harmonic wavelength that can be produced in CLBO is approximately 233.8 nanometers at −273° centigrade (0° Kelvin).

Figure 6:
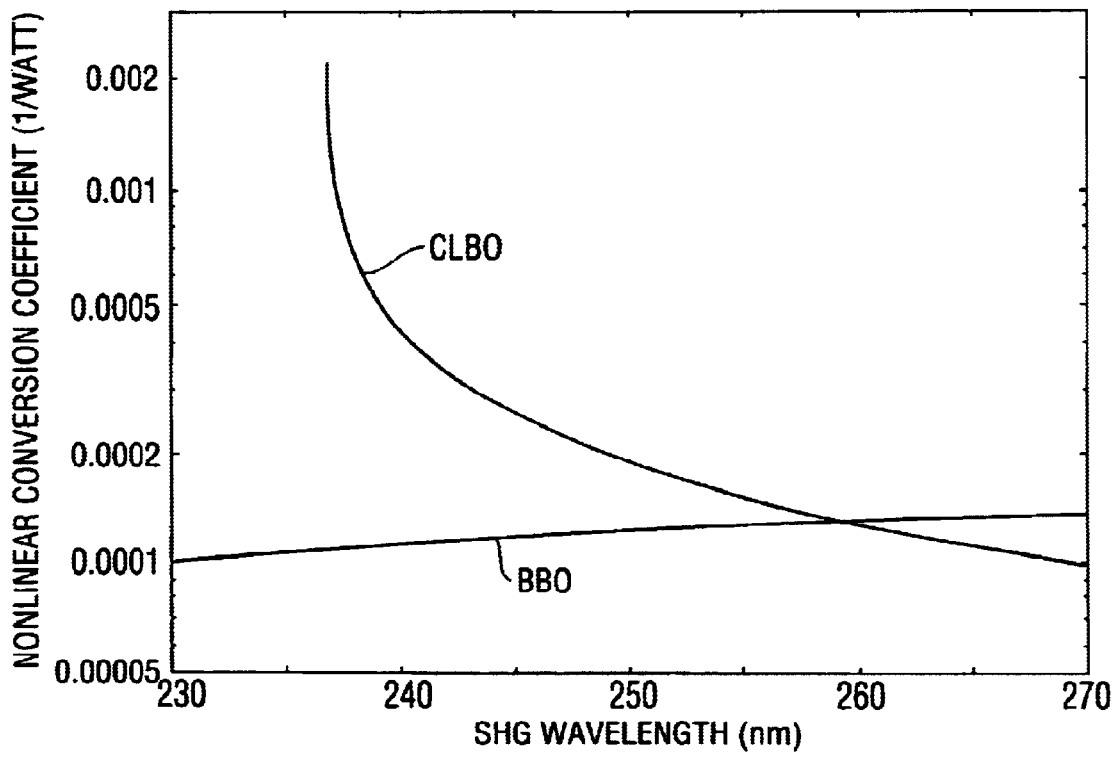
FIG. 6 is a graph which indicates how nonlinear conversion efficiency changes with wavelength for BBO and CLBO.

FIG. 6 shows a comparison of the nonlinear conversion coefficients for CLBO and BBO versus second harmonic wavelength. The vertical scale is logarithmic. Below approximately 260 nanometers, Γ for CLBO is larger than for BBO. At 266 nanometers, the fourth harmonic of the 1064 nanometer laser line of Nd:YAG, the nonlinear conversion coefficient is larger for BBO than for CLBO. This is consistent with experiment, as generation of 266 nanometer light in BBO is generally more efficient than in CLBO.

One significant fact illustrated by FIG. 6 is that near 237 nanometers, the nonlinear conversion coefficient for CLBO is approximately 20 times larger than for BBO.

Because CLBO is easily damaged by contact with water, CLBO crystals used for frequency conversion are typically heated to around 140° centigrade to reduce hygroscopic deterioration. However, because it is possible to provide adjustment of the NCPM interaction condition by adjusting the temperature of the CLBO crystal, the applicants have investigated the response of CLBO at other temperatures.

Figure 7:
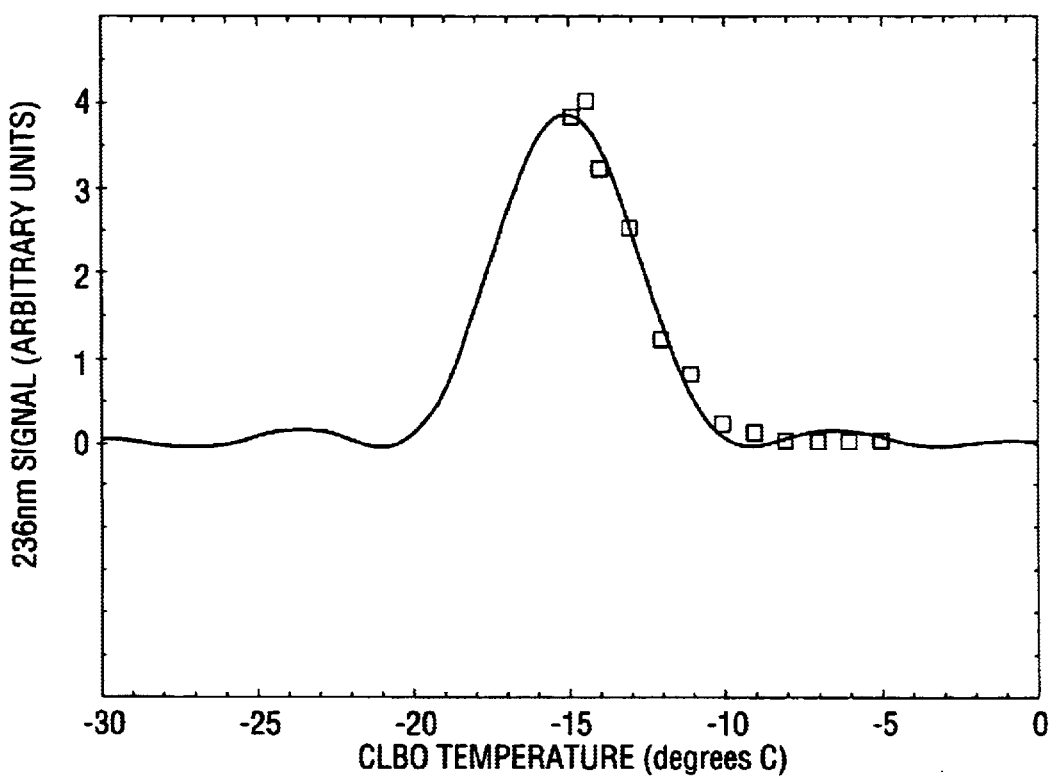
FIG. 7 indicates temperature-tuned non-critical phase-matching data for 236 nanometer generation by frequency-doubling of the 473 nanometer second harmonic of the 946 nanometer line of an Nd:YAG laser.

FIG. 7 shows 236 nanometer power as a function of CLBO crystal temperature. FIG. 7 also indicates a $\text{sinc}^2$ fit to the data. Full width half maximum of the central lobe corresponds to 5.6° C.

In order to exploit the higher power generation possible at lower temperatures, some embodiments of laser device 100 do not heat second nonlinear crystal 145. Instead, these embodiments maintain the temperature inside container 150 at approximately −15° C. In one embodiment, this temperature is obtained by using a thermo-electric cooler (TEC). TECs are available from a number of sources including Melcor of Trenton, N.J.

Figure 8:
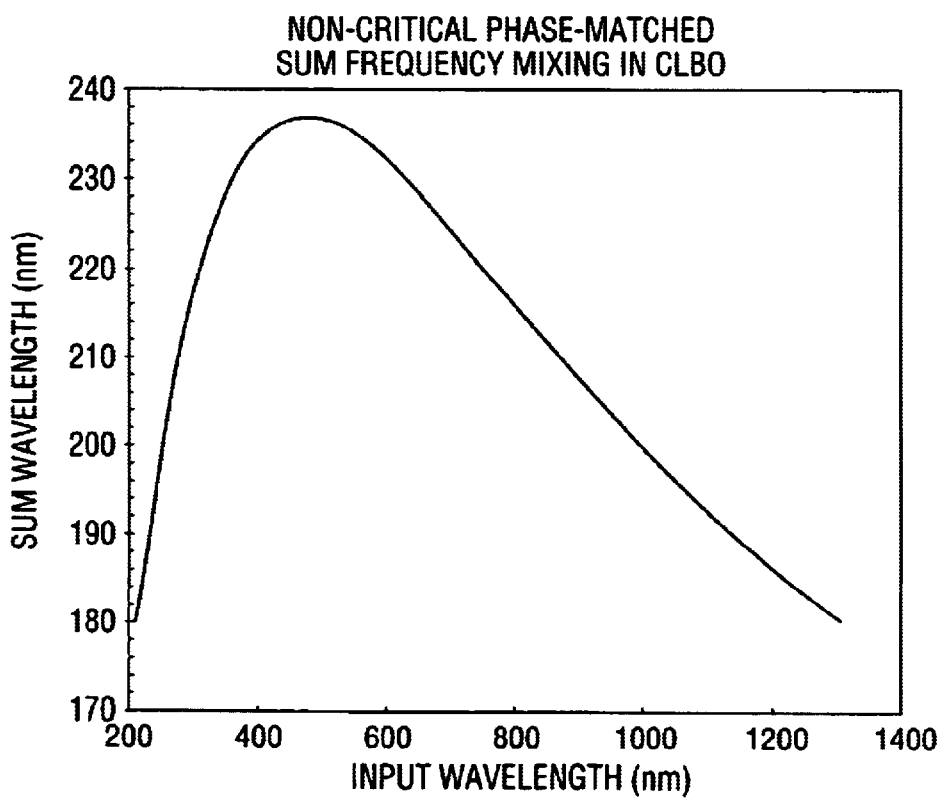
FIG. 8 shows wavelengths that provide for NCPM sum-frequency mixing in CLBO.

The curve in FIG. 8 shows the wavelength of the sum frequency as a function of the input wavelength. This curve corresponds to a non-critical phase-matching condition in CLBO. The maximum sum wavelength is produced when the two wavelengths that are being summed are equal, which corresponds to second harmonic generation. Thus, this point of the curve indicates two blue 474 nanometer photons summing to produce 237 nanometer ultraviolet light.

As mentioned previously, the shortest wavelength that can be generated in CLBO by frequency doubling is about 233 nanometers at 0° Kelvin. However, it is possible to generate shorter wavelengths by sum-frequency generation (SFG), also known as sum-frequency mixing. Conceptually, SFG is similar to frequency doubling, except the two photons that are combined are not the same wavelength. For shorter sum wavelengths, one wavelength will be longer than 474 nanometers and the other will be shorter than 474 nanometers. For example, the curve in FIG. 8 illustrates that the fourth harmonic of the 946 nanometer line of Nd:YAG will mix with light at approximately 1077 nanometers to produce a sum wavelength near 194 nanometers.

Phase-matched generation of sum wavelengths longer than 194 nanometers can be produced using 236.5 nanometer light and infrared wavelengths longer than 1077 nanometers by tuning the angle of the CLBO crystal away from the NCPM orientation. The nonlinear conversion coefficient for this angle-tuned sum-frequency interaction will be less than for the NCPM interaction, however. If one of the wavelengths is broadly tunable, then the sum wavelength can also be broadly tunable.

Figure 9:
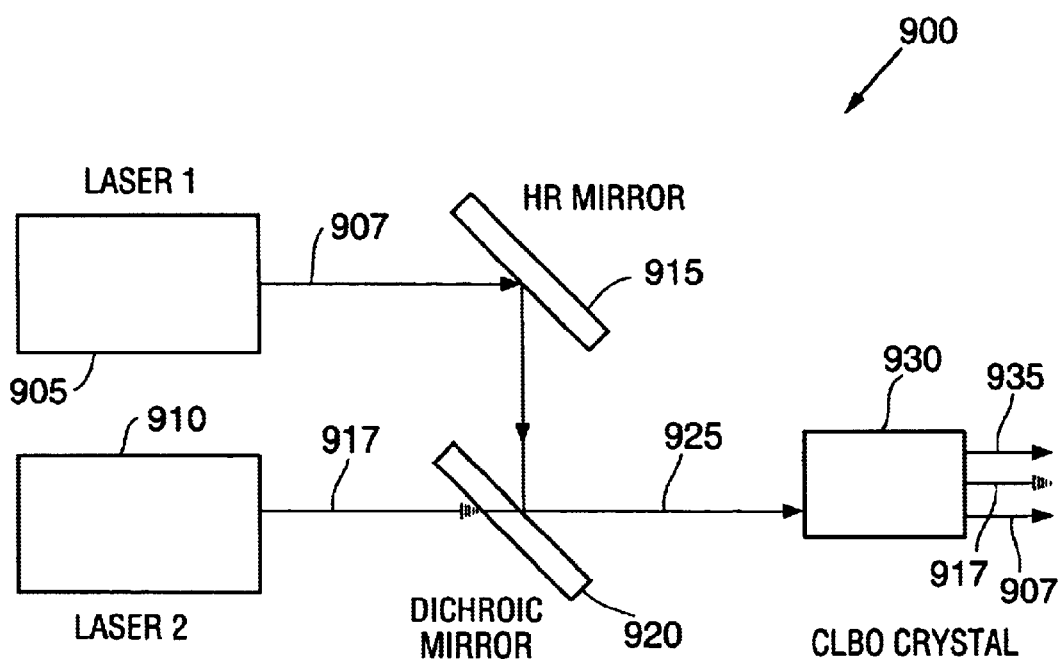
FIG. 9 illustrates one embodiment of laser device 900, which is configured for sum-frequency mixing.

FIG. 9 illustrates one geometry for laser device 900. The operation of laser device 900 is based upon the principles of SFG and in particular on the data shown in FIG. 8 for non-critically phase-matched SFG in CLBO. In summary, first laser 905 emits first beam 907 at a first frequency and first beam 907 is reflected by mirrors 915 and 920 to overlap beam 917 and directed into CLBO crystal 930. Second laser 901 emits second beam 917 at a second frequency and second beam 917 is transmitted by mirror 920 to CLBO crystal 930, wherein first beam 907 and second beam 917 are mixed to produce output beam 935 at a desired frequency.

In one embodiment of laser device 900, first laser 905 is an embodiment of laser device 100 and emits first beam 907 at approximately 237 nanometers. Second laser 910 is a rare earth doped garnet laser, such as an $Nd:Y_2O_3$ or $Nd:Y_2SiO_5$ laser, and emits second beam 917 at approximately 1077 nanometers. CLBO crystal 930 combines the 237 nanometer photons of first beam 907 and the 1077 nanometer photons of second beam 917 in an NCPM SFG interaction to produce output beam 935 at approximately 194 nanometers.

In a second embodiment of laser device 900, first laser 905 is a rare earth doped garnet laser, such as an Nd:YLF laser, and emits first beam 907 at approximately 209 nanometers. In one such embodiment, first beam 907 is the 5th harmonic of a an Nd:YLF laser. Second laser 910 is also a rare earth doped garnet laser and emits second beam 917 at approximately 1305 nanometers. CLBO crystal 930 combines first beam 907 and second beam 917 in an NCPM SFG interaction to produce output beam 935 at approximately 180 nanometers.

While the best mode for practicing the invention has been described in detail, those of skill in the art will recognize that there are numerous alternative designs, embodiments, modifications and applied examples which are within the scope of the present invention. Accordingly, the scope of this invention is not limited to the previously described embodiments.

We claim:

1. A method of generating ultraviolet light, comprising the steps of:
   tuning a neodymium-doped yttrium aluminum garnet crystal laser to output a first fundamental beam at approximately 946 nanometers;
   doubling the frequency of the first fundamental beam to produce a second harmonic beam having a wavelength of approximately 473 nanometers;

orienting a cesium lithium borate crystal by a phase-matching angle that corresponds to a non-critical phase-matching condition;

cooling said cesium lithium borate crystal to a temperature between −10 degrees centigrade and −20 degrees centigrade; and passing said second harmonic beam through said cesium lithium borate crystal to produce a fourth harmonic beam having a wavelength of approximately 236.5 nanometers.

2. The method of claim 1, further comprising the step of disposing the cesium lithium borate crystal in a container of dry inert gas.

3. The method of claim 2, wherein the dry inert gas is selected from the group consisting of nitrogen, dry air, helium, neon, argon, krypton and xenon.

4. The method of claim 1, further comprising the step of disposing the cesium lithium borate crystal in a vacuum.

5. The method of claim 1, said step of passing said second harmonic beam through said cesium lithium borate crystal further comprising the step of confocal focusing the second harmonic beam into the cesium lithium borate crystal.

6. The method of claim 1, further comprising the steps of:

tuning a rare earth doped garnet laser to emit a second fundamental beam at a wavelength of approximately 1077 nanometers;

directing the second fundamental beam and the fourth harmonic beam to a second cesium lithium borate crystal; and sum-frequency mixing the second fundamental beam and the fourth harmonic beam in the second cesium lithium borate crystal to produce an output beam at approximately 194 nanometers.

7. The method of claim 1, wherein said step of orienting said cesium lithium borate crystal further comprises the step of selecting approximately 90° for said phase-matching angle.

8. The method of claim 1, wherein said step of doubling the frequency of the first fundamental beam to produce the second harmonic beam further comprises the step of passing said first fundamental beam through a nonlinear crystal.

9. The method of claim 8, wherein said nonlinear crystal is selected from the group consisting of periodically-poled potassium titanyl phosphate, BBO and LBO.

10. The method of claim 8, wherein said step of passing said first fundamental beam through the nonlinear crystal further comprises the step of confocally focusing the first fundamental beam into the nonlinear crystal.

11. An apparatus for generating ultraviolet light, comprising:

means for tuning a neodymium-doped yttrium aluminum garnet crystal to output a first fundamental beam at approximately 946 nanometers;

a nonlinear crystal, wherein said nonlinear crystal frequency doubles the fundamental beam to produce a second harmonic beam having a wavelength of approximately 473 nanometers; and a cesium lithium borate crystal oriented to a phase-matching angle that corresponds to a non-critical phase-matching condition, wherein said cesium lithium borate crystal doubles said second harmonic beam to produce a fourth harmonic beam having a wavelength of approximately 236.5 nanometers; and means for cooling said cesium lithium borate crystal to a temperature between −10 degrees centigrade and −20 degrees centigrade.

12. The apparatus of claim 11, further comprising means for disposing the cesium lithium borate crystal in dry inert gas.

13. The apparatus of claim 12, wherein the dry inert gas is selected from the group consisting of nitrogen, dry air, helium, neon, argon, krypton and xenon.

14. The apparatus of claim 11, further comprising means for disposing the cesium lithium borate crystal in a vacuum.

15. The apparatus of claim 11, further comprising means for confocal focusing of the second harmonic beam into the cesium lithium borate crystal.

16. The apparatus of claim 11, further comprising:

means for emitting a second fundamental beam at a wavelength of approximately 1077 nanometers;

means for directing the second fundamental beam and the fourth harmonic beam to a second cesium lithium borate crystal; and means for tuning the second cesium lithium borate crystal to sum-frequency mix the second fundamental beam and the fourth harmonic beam to produce an output beam at approximately 194 nanometers.

17. The apparatus of claim 11, wherein said phase-matching angle is approximately 90°.

18. An apparatus for generating ultraviolet light, comprising:

an active laser medium comprising a garnet crystal doped with a rare earth element;

a diode pump laser for pumping the active laser medium;

a resonator for generating a fundamental beam having a wavelength of approximately 946 nanometers from the pumped active laser medium;

a periodically-poled potassium titanyl phosphate crystal for producing a second harmonic beam having a wavelength of approximately 473 nanometers;

a cesium lithium borate crystal oriented for non-critical phase-matching, for producing a fourth harmonic beam having a wavelength of approximately 237 nanometers; and means for cooling said cesium lithium borate crystal to a temperature between −10 degrees centigrade and −20 degrees centigrade.

19. The apparatus of claim 18, wherein the active laser medium comprises a neodymium-doped yttrium aluminum garnet crystal.

20. The apparatus of claim 19, wherein the neodymium-doped yttrium aluminum garnet crystal comprises a first un-doped end portion, a doped central portion and a second un-doped end portion.

* * * * *